(12) United States Patent
Azad et al.

(10) Patent No.: US 6,299,681 B1
(45) Date of Patent: *Oct. 9, 2001

(54) SINGLE CRYSTAL CONVERSION CONTROL

(75) Inventors: Farzin Homayoun Azad, Clifton Park; Marshall Gordon Jones, Scotia, both of NY (US)

(73) Assignee: General Electric Company, Schenectady, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/200,562

(22) Filed: Nov. 27, 1998

(51) Int. Cl.[7] .................................................... G30B 1/04
(52) U.S. Cl. ...................... 117/8; 117/7; 117/10; 117/931
(58) Field of Search ............................ 117/7, 8, 10, 931

(56) References Cited

U.S. PATENT DOCUMENTS

| 4,234,358 | * | 11/1980 | Celler et al. ............................ 117/10 |
| 4,469,551 | * | 9/1984 | Laude ...................................... 117/10 |
| 5,365,875 | * | 11/1994 | Asai et al. .............................. 117/10 |
| 5,427,051 | | 6/1995 | Maxwell et al. . |
| 5,432,122 | * | 7/1995 | Chae ....................................... 117/10 |
| 5,454,347 | * | 10/1995 | Shibata et al. .......................... 117/10 |
| 5,591,668 | * | 1/1997 | Maegawa et al. ...................... 117/10 |

FOREIGN PATENT DOCUMENTS

| 19546992 | | 12/1995 | (DE) . |
| 01018985 | | 1/1989 | (EP) . |
| 0625594 | | 11/1994 | (EP) . |
| 0645475 | | 3/1995 | (EP) . |
| 0645477 | | 3/1995 | (EP) . |
| 0667404 | | 8/1995 | (EP) . |
| 04-294523 | * | 10/1992 | (JP) ...................................... 117/10 |

OTHER PUBLICATIONS

U.S. Patent application Ser. No. 09/206,721, filed Dec. 7, 1998, (Docket RD–22721).

* cited by examiner

*Primary Examiner*—Robert Kunemund
(74) *Attorney, Agent, or Firm*—Patrick K. Patnode; Douglas E. Stoner

(57) ABSTRACT

A polycrystalline article is converted to a single crystal in a solid-state process. Heat is applied at a first end of the article to effect a predetermined spatial temperature profile thereat having a maximum temperature approaching a melting temperature thereof. The temperature profile is maintained to initiate conversion at the first end. The heat is moved along the article toward an opposite second end to correspondingly propagate the conversion along the article.

8 Claims, 2 Drawing Sheets

SINGLE CRYSTAL CONVERSION CONTROL

BACKGROUND OF THE INVENTION

The present invention relates generally to the conversion of a polycrystalline article into a single crystal, and, more specifically, to the control thereof.

U.S. Pat. No. 5,427,051—Maxwell et al. discloses an apparatus and method for the solid-state conversion of polycrystalline alumina to single crystal sapphire. In that process, a local energy source, such as a carbon dioxide laser, heats one end of an alumina tube to a temperature approaching the melting temperature of alumina to initiate and automatically propagate solid-state single crystal conversion along the length of the tube. To prevent thermal shock, laser heat is applied in a ring around the tube by rotating the tube, and in one trial the tube is slightly translated in addition.

The configuration of an article and the application of the heat thereon affect whether or not single crystal conversion is obtained without undesirable thermal shocking.

Accordingly, there is a need for an improved conversion and control process for conversion of a polycrystalline article into a single crystal.

BRIEF SUMMARY OF THE INVENTION

A polycrystalline article is converted to a single crystal in a solid-state process. Heat is applied at a first end of the article to effect a predetermined spatial temperature profile thereat having a maximum temperature approaching a melting temperature of the article. The temperature profile is maintained to initiate conversion at the first end. The heat is moved along the article toward an opposite second end to correspondingly propagate the conversion along the article.

DETAILED DESCRIPTION OF THE INVENTION

Figure 1:
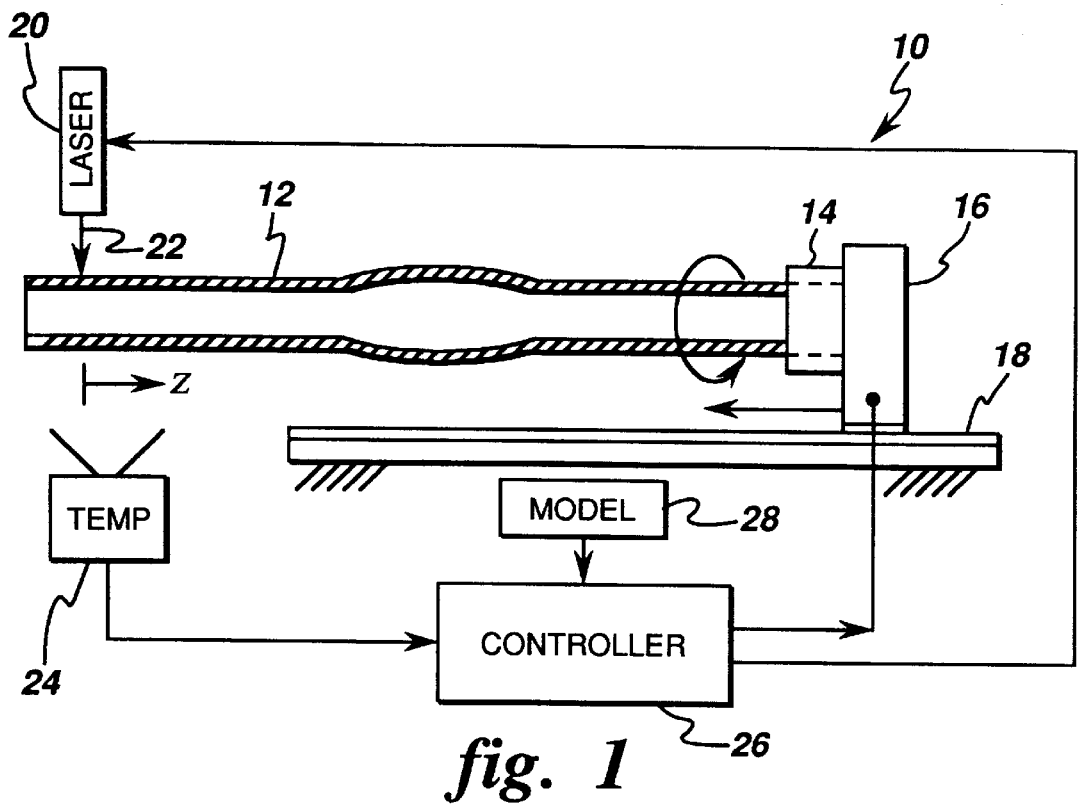
FIG. 1 is a schematic representation of an exemplary apparatus for the solid-state conversion of a polycrystalline article to a single crystal in accordance with an exemplary embodiment of the present invention.

Illustrated schematically in FIG. 1 is an apparatus 10 for effecting the single crystal conversion of a polycrystalline article 12 in accordance with an exemplary embodiment of the present invention. Article 12 may have any suitable configuration such as an elongate tube, which configuration, for example, may have a length of about 100 mm, with an outer diameter of about 5.5 mm, and a wall thickness of about 0.5 mm. Article 12 is shown as having a central enlarged portion or bulge to exemplify structural variations within article 12.

Article 12 may be formed, for example, of a suitable polycrystalline material that may be converted to single crystal material in a solid-state conversion process. For example, article 12 may be in the initial form of polycrystalline alumina, such as that available under the Lucalox™ brand available from The General Electric Company™ typically pre-processed for driving out therefrom magnesium oxide for achieving a magnesia level preferably below 70 wppm.

Polycrystalline alumina may be converted into a single crystal alumina or sapphire in a solid-state process. One example of this conversion is disclosed in U.S. Pat. No. 5,427,051, which patent is incorporated herein by reference. The present invention is an improvement over the solid-state crystal conversion process of that patent for improving the repeatability of conversion for a batch of tubes, 15 and for extending the process to larger or longer articles, and articles having varying configurations.

Article 12 is preferably mounted in a chuck 14 driven by a motor 16 for effecting a suitable rotary speed of article 12. Chuck 14 and motor 16 are typically mounted on a translation carriage or table 18 for translating the supported article 12 along an axial or centerline axis as article 12 is rotated by motor 16.

A heater in the exemplary form of a carbon dioxide laser 20, and associated optics, is provided for emitting a heating or laser beam 22 at the surface of a first end of article 12, with an opposite or second end of article 12 being supported in chuck 14.

During operation, article 12 is rotated so that laser 20 may initially heat the first end of article 12 with a uniform ring of heat therearound in a suitable environment, such as argon gas. Since the process conditions leading to the onset of solid-state crystal conversion, and the speed with which the conversion takes place are not well understood, the present invention provides a diagnostic method for evaluating the progressive stages of conversion using controlled temperature profiles. From this, predetermined temperature profiles are used to generate spatially selective and temporally controlled densfication and conversion of article 12.

Figure 2:
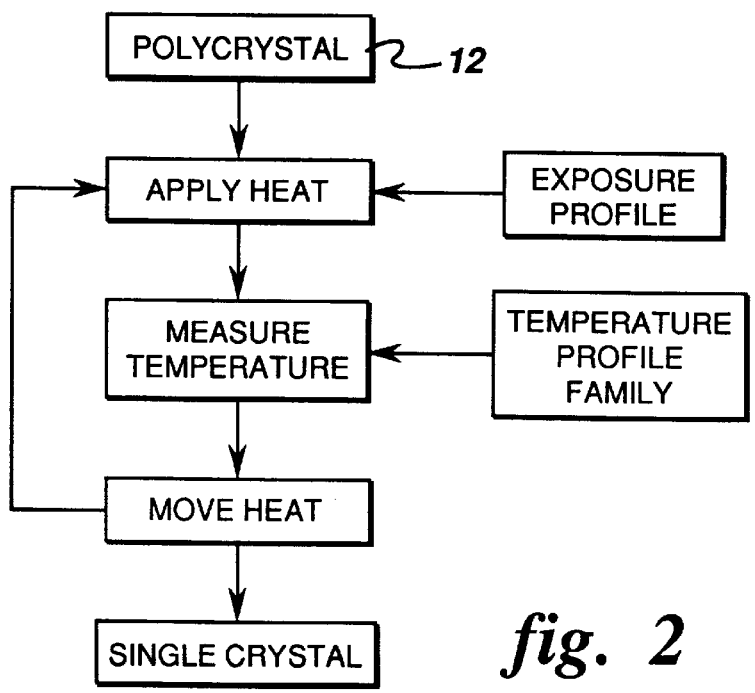
FIG. 2 is a flowchart of an exemplary method for controlling single crystal conversion of the polycrystalline article illustrated in FIG. 1 in accordance with an exemplary embodiment of the present invention.

As initially illustrated in FIG. 1, apparatus 10 is configured for controlling the solid-state crystal conversion of polycrystalline article 12 in a process illustrated in the exemplary flowchart of FIG. 2. The process begins by applying heat at the first end of article 12 using laser 20 to effect a predetermined spatial temperature distribution or profile thereat having a maximum temperature approaching, and preferably not exceeding, the melting temperature of article 12.

Figure 3:
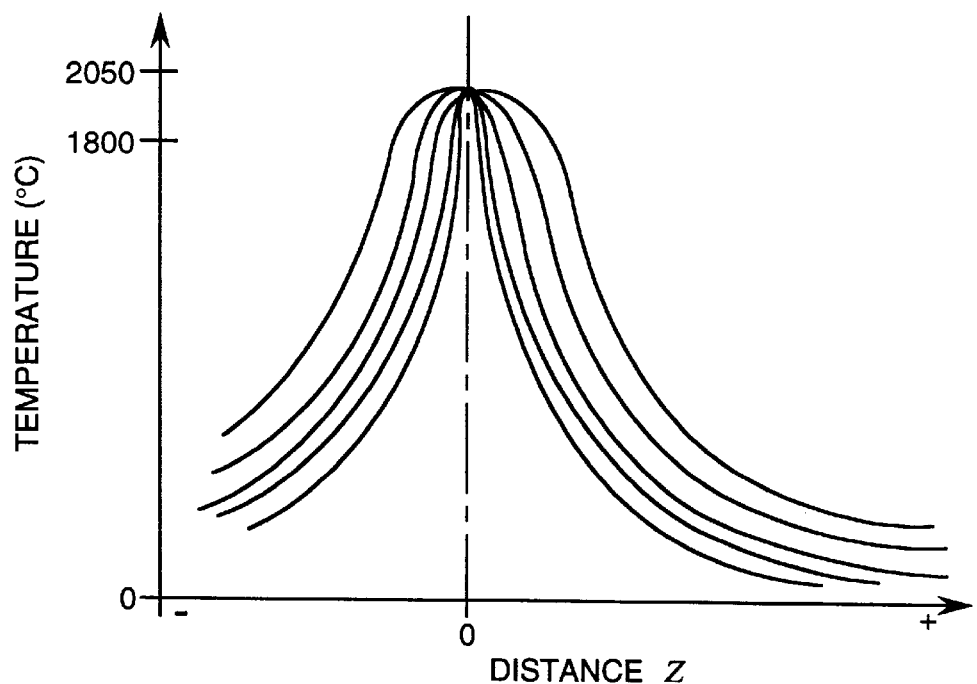
FIG. 3 is a graph of a family of spatial temperature profiles for being applied to the polycrystalline article of FIG. 1 in accordance with an exemplary embodiment of the present invention.

FIG. 3 is a graph of an exemplary family of spatial temperature profiles at the surface of article 12 directly below laser 20.

The temperature is maximum at the location of the incident laser beam 22, which location corresponds with a Z-axis dimension of zero. Laser beam 22 is concentrated at one axial plane of article 12 and therefore the temperature profile decreases on opposite sides thereof due to heat transfer mechanisms associated with the particular article 12. For the exemplary polycrystalline alumina article 12, the maximum temperature is typically less than the melting temperature of 2,050° C. and typically greater than about 1,800° C.

The spatial temperature profile is effected using a suitable temporal profile that gradually increases the local temperature of article 12 below laser beam 22 by controlling the power laser 20 until the desired maximum temperature is reached without effecting undesirable thermal shock in article 12. The resulting spatial temperature profile is maintained for a suitable time to initiate the solid-state crystal conversion of article 12 at a first end directly below the incident laser beam 22. The heat imparted by laser beam 22 may then be moved along the longitudinal axis of article 12 toward an opposite end to correspondingly propagate the solid-state conversion therealong.

The incident heat is preferably moved to correspondingly move the spatial temperature profile along article 12 for a predetermined exposure time to propagate the conversion therealong. Carriage 18 allows the entire article 12 to be translated axially relative to laser 20, which laser 20 is typically stationary, so that the desired spatial temperature profile may be moved along article 12 for promoting the single crystal conversion as article 12 is correspondingly translated. Alternatively, laser 20 may be moved relative to the stationary article.

As shown in FIG. 1, an imaging pyrometer 24 may be aimed or directed at article 12 in the region of the applied laser beam 22 for measuring the surface temperature of article 12 at the heated portion thereof. Pyrometer 24 is operatively joined to a controller 26 that in turn is joined to laser 20 for adjusting the power thereof. Controller 26 may have any conventional form, such as a digitally programmable computer, preferably operated in a feedback closed-loop for controlling the spatial temperature profile of article 12 at incident laser beam 22 in response to the measured temperature thereat. The power of laser 20 may be adjusted for controlling heat flux of the applied heat for in turn effecting the spatial temperature profile.

The solid-state conversion process is driven by the local temperature of article 12 at the incident laser beam 22, and correspondingly the local temperature gradient thereat as well as exposure time. FIG. 3 illustrates a family of predetermined spatial temperature profiles all having a common maximum temperature at the point of heat application, but differing in temperature profile forward and aft thereof. The family of spatial temperature profiles is center-peaked and varies in spatial extent forward and aft of the incident beam, and may also vary in local temperature gradient.

Figure 4:
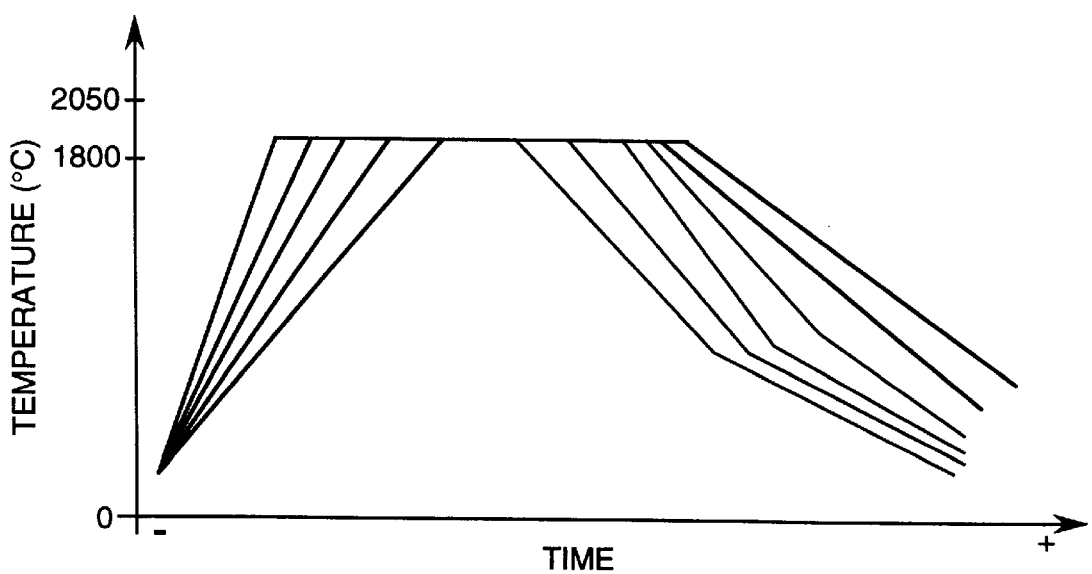
FIG. 4 is a graph of temporal temperature profiles for the heat applied to article 12 illustrated in FIG. 1 in accordance with an exemplary embodiment.

FIG. 4 is a graph of a family of predetermined temporal temperature profiles associated with the spatial profiles of FIG. 3. As indicated above, the initial application of heat to article 12 begins at low power and increases gradually to correspondingly increase the maximum temperature of article 12 without introducing undesirable thermal shock therein. Upon reaching a maximum temperature, the heat influx may be maintained constant for a predetermined time for initiating and propagating the solid-state conversion process. Upon conversion, the physical properties of article 12 change, including the thermal conductivity thereof, and the amount of heat input may be correspondingly reduced to again protect article 12 from undesirable degradation such as thermal shock.

Since the spatial temperature profile is center-peaked, moving the heat along article 12 will effect corresponding spatial and temporal profiles along the remainder of the length of article 12 as the conversion process continues. The conversion process may be optimized by applying the heat to article 12 to effect a corresponding one of the spatial temperature profiles at different locations along article 12 from the beginning at the first end, to the middle of article 12, and finally to the opposite or second end thereof.

Where article 12 is uniform in configuration, the spatial temperature profiles are preferably the same or equal at the different axial locations along article 12. Where article 12 changes in configuration along an axis, the spatial temperature profiles are preferably different at the different axial locations along article 12 to promote the conversion thereat.

Correspondingly, for uniform portions of article 12, the exposure time at the maximum temperature is preferably equal at the different axial locations along article 12. For the varying configuration of article 12, the exposure time at the maximum temperature is preferably different at the different axial locations along article 12.

The spatial and temporal temperature profiles illustrated in FIGS. 3 and 4 are merely examples of corresponding profiles families whose local temperature, local temperature gradient, and exposure time may be optimized for specific configurations of article 12 and the specific material composition thereof. A thermal model 28, as shown schematically in FIG. 1, may be conventionally developed for the specific article 12 and laser 20 heat source. Model 28 may be used to analytically determine the power and heat flux required by laser 20 and the corresponding scan rate of axial translation of article 12 relative thereto for producing a desired family of temperature profiles such as those illustrated in FIGS. 3 and 4.

The family of temperature profiles may be developed or obtained by correspondingly applying heat to a plurality of article 12 in a systematic development program to determine onset of the conversion and speed of single crystal propagation. The use of different temperature profiles and exposure times combined with radiometric monitoring of article 12 surface temperature distribution will enable the determination of the process conditions associated with various stages of densification and conversion. From the family of temperature profiles corresponding with solid-state conversion and propagation, spatially selective and temporally controlled densification and conversion of article 12 may be controlled using predetermined temperature profiles maintained in corresponding schedules in controller 26. Either open-loop or closed-loop control of the conversion process may be effected in controller 26 for optimizing the single crystal conversion of article 12 without thermal shock over the entire length of article 12.

The invention has particular utility for the solid-state conversion of polycrystalline alumina, with the maximum temperature in the spatial profiles being greater than about 1,800° C., with the conversion effecting single crystal sapphire along the entire length of article 12 irrespective of the particular configuration of article 12. By applying the family of spatial and temporal profiles, optimum temperature control may be effected by controller 26 to improve the solid-state conversion process along the length of article 12.

While there have been described herein what are considered to be preferred and exemplary embodiments of the present invention, other modifications of the invention shall be apparent to those skilled in the art from the teachings herein, and it is, therefore, desired to be secured in the appended claims all such modifications as fall within the true spirit and scope of the invention.

What is claimed is:

1. A method for controlling solid-state single crystal conversion of a polycrystalline article comprising:

applying heat to a first end of said article to effect a predetermined spatial temperature profile thereat having a maximum temperature approaching a melting temperature thereof;

maintaining said temperature profile to initiate said conversion at said first end;

moving said heat along said article toward an opposite second end thereof to correspondingly propagate said conversion therealong;

wherein said heat is moved to correspondingly move said temperature profile along said article for a predetermined exposure time to propagate said conversion therealong;

measuring the temperature of said article adjacent to said heated portion; and controlling flux of said applied heat to effect said spatial temperature profile.

2. A method according to claim 1 further comprising:

providing a family of said predetermined spatial temperature profiles; and applying said heat to said article to effect a corresponding one of said profiles at different locations along said article.

3. A method according to claim 2 wherein said profiles are different at said different locations along said article.

4. A method according to claim 2 wherein said profiles are equal at said different locations along said article.

5. A method according to claim 2 wherein said exposure time is different at said different locations along said article.

6. A method according to claim 2 wherein said exposure time is equal at said different locations along said article.

7. A method according to claim 2 wherein said family of temperature profiles is obtained by correspondingly applying said heat to a plurality of said articles to determine onset of said conversion and speed of said propagation.

8. A method according to claim 2 wherein said article is polycrystalline alumina, said maximum temperature is greater than about 1,800° C., and said solid-state conversion effects sapphire along the entire length of said article.

* * * * *